United States Patent [19]

Tada et al.

[11] Patent Number: 4,596,700

[45] Date of Patent: Jun. 24, 1986

[54] APPARATUS FOR PRODUCING SINGLE CRYSTAL

[75] Inventors: Kohji Tada; Kotani Toshihiro; Masahiro Nakagawa, all of Osaka, Japan

[73] Assignee: Sumitomo Electric Industries, Ltd., Osaka, Japan

[21] Appl. No.: 671,080

[22] Filed: Nov. 13, 1984

[30] Foreign Application Priority Data

Nov. 22, 1983 [JP] Japan ................. 58-219744

[51] Int. Cl.[4] ............................. B01D 9/00
[52] U.S. Cl. ................... 422/249; 156/617 V; 156/617 SP; 156/DIG. 83; 432/265
[58] Field of Search ............ 422/249; 156/617 V, 156/DIG. 83, 617 SP; 432/263-265

[56] References Cited

U.S. PATENT DOCUMENTS

| 3,499,736 | 3/1970 | Zwaneburg | 156/617 SP |
| 3,627,499 | 12/1971 | Le Duc et al. | 422/249 X |
| 3,716,345 | 2/1973 | Grabmaier | 156/617 SP |
| 3,857,679 | 12/1974 | Allred | 422/249 |

FOREIGN PATENT DOCUMENTS 729096  3/1966  Canada ............... 156/620.2

OTHER PUBLICATIONS

IBM Technical Disclosure Bulletin, vol. 9, #12, May 1967, "Growing Single Crystals of High Melting, Decomposable Compounds", pp. 1674-1676.

Primary Examiner—Robert Lindsay
Attorney, Agent, or Firm—Wenderoth, Lind & Ponack

[57] ABSTRACT

An apparatus for producing a single crystal according to the CZ method, which comprises a closed container consisting of upper and lower halves and having a shaft for pulling up the single crystal, at least a part of which contacting with said vapor of the elements is made of a material containing an element of the same group of the periodic table as that of component elements of the single crystal, a gap between said shaft and the container and an opening between said upper and lower halves of the container being sealed with a sealing material, at least one reservoir positioned in the container for supplying vapor of a volatile component element of the single crystal, and a heating means provided around the container; wherein a hot zone of the apparatus including the container is made of a material which has an X-ray absorption coefficient not larger than 5 cm$^2$/g, and said material of the hot zone has such thickness that X-ray transmittance through the whole hot zone is 10$^{-6}$ or more so as to monitor the single crystal being pulled up by X-ray fluoroscopy.

4 Claims, 3 Drawing Figures

APPARATUS FOR PRODUCING SINGLE CRYSTAL

FIELD OF THE INVENTION

The present invention relates to an apparatus for producing a single crystal. More particularly, it relates to an apparatus for producing a single crystal of a compound consisting of elements of the III-V groups of the periodic table having high vapor pressure (hereinafter referred to as "volatile elements") by a Czochralski method (hereinafter referred to as "CZ method").

BACKGROUND OF THE INVENTION

As one of the modifications of the CZ method, there is known a hot wall method in which a liquid sealing material such as molten $B_2O_3$ is used as a sealing material for sealing the apparatus. In this method, a single crystal is pulled up in a container 1 having a structure shown in FIG. 1 which is filled with vapor of volatile component elements of the single crystal (e.g. As). In FIG. 1 the container 1 is provided with a crucible 2 containing a molten raw material and a pulling shaft 4 which pulls up the single crystal with rotation. To the lower end of the shaft 4, a seed crystal 5 is attached. The container is divided into upper and lower portions at a certain part of a side wall, and liquid sealing materials 8 seal an opening 6 of the container 1 and a gap 7 between the pulling shaft 4 and the container 1. The seed crystal is dipped in a surface of the molten raw material in the crucible 2 and, after wetting, pulls up the single crystal with rotation of the seed crystal 5.

Since the container 1 used in this method is made of Quartz, in case of the production of, for example, a GaAs single crystal, the raw material reacts with quartz as follows:

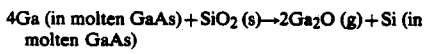

and GaAs is contaminated with Si. Therefore, it is difficult to produce, for example, a single crystal suitable for the production of an undoped semi-insulating substrate by the above conventional method.

It is proposed to use pyrolytic boron nitride (hereinafter referred to as "PBN") in place of quartz as the material of the container 1. Since PBN is, however, expensive and its workability is poor, the shape of the container is limited. Further, since PBN is opaque and inevitably the container itself is opaque, the single crystal contained in the container cannot be optically monitored.

In addition, the vapor of the component elements filling the container is supplied by vaporizing solid elements which are beforehand charged in the container in excess amounts, and the vapor pressure is not controlled during pulling up the single crystal. Therefore, a composition of the single crystal cannot be controlled, so that it is difficult to produce a high quality single crystal containing less impurities and having less inherent and crystal defects.

SUMMARY OF THE INVENTION

One object of the invention is to provide an apparatus for producing a single crystal which is not contaminated with an electrically active substances immigrated from a container material of the apparatus.

Another object of the invention is to provide an apparatus for producing a single crystal by which vapor pressure of volatile component elements is controlled so as to adjust a composition of a molten raw material.

Further object of the invention is to provide an apparatus for producing a single crystal by which growth of the pulled single crystal can be monitored by X-ray fluoroscopy.

DETAILED DESCRIPTION OF THE DRAWINGS

According to the present invention, there is provided an apparatus for producing a single crystal according to the CZ method, which comprises a closed container consisting of upper and lower halves and having a shaft for pulling up the single crystal, at least a part of which contacting with said vapor of the elements is made of a material containing an element of the same group of the periodic table as that of component elements of the single crystal, a gap between said shaft and the container and an opening between said upper and lower halves of the container being sealed with a sealing material, at least one reservoir positioned in the container for supplying vapor of a volatile component element of the single crystal, and a heating means provided around the container; wherein a hot zone of the apparatus including the container is made of a material which has an X-ray mass absorption coefficient not larger than 5 cm$^2$/g, and said material of the hot zone has such thickness that X-ray transmittance through the whole hot zone is $10^{-6}$ or more so as to monitor the single crystal being pulled up by X-ray fluoroscopy.

Examples of the single crystal to be produced by means of the apparatus of the invention are those made of compounds of volatile component elements such as those of the III-V groups of the periodic table (eg. GaAs, GaP, InAs, InP, etc.).

Figure 1:
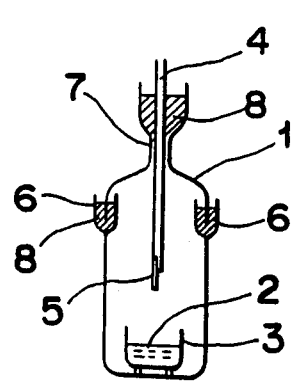
FIG. 1 shows a schematic crosssectional view of a conventional container for pulling up a single crystal by the CZ method.
Figure 2:
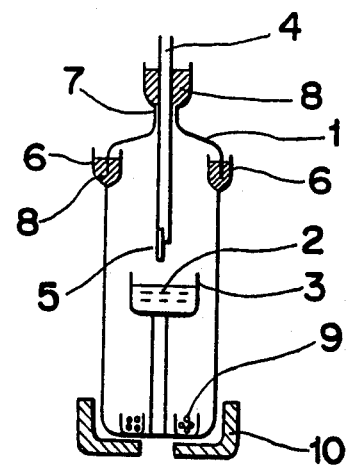
FIG. 2 shows a schematic crosssectional view of a container of an apparatus of the invention.

Now, the invention is illustrated by making reference to drawings in which FIG. 2 shows an embodiment of the apparatus of the invention. In FIG. 2, the same numerals indicate the same or corresponding parts in FIG. 1.

The apparatus of the invention has fundamentally a similar construction to that of FIG. 1 which is used in the hot wall method. However, the apparatus of the invention may have a different construction.

In the container 1, there positioned reservoirs 9 for supplying the volatile component elements such as As. A temperature of the portion of the container where the reservoirs are positioned is controlled by a reservoir heating means 10 independently from the temperature of the portion where the single crystal is pulled up, thereby controlling the vapor pressure of the component elements in the container 1 to prevent fluctuation of the composition of the molten raw material from the stoichiometric composition.

At least a part of the container 1 which contacts with the vapor of the component elements, for example, an inner surface is made of a material which is isoelectronic with one of the component elements of the single crystal. Examples of such material are boron nitride (hereinafter referred to as "BN"), PBN and aluminum nitride (hereinafter referred to as "AlN"). Said part of the container may be made of the material itself, or of graphite or quartz coated with the material. Thereby, the molten raw material is not contaminated with electrically active impurities contained in the container material.

Quality and thickness of the whole hot zone including the container 1, an outer chamber, a susceptor, crucible 3, etc are selected so that the X-ray mass absorption coefficient of the hot zone is not larger than 5 cm$^2$/g. In addition, the hot zone is made so as to have such thickness that the hot zone is made so that X-ray transmittance through the whole hot zone is 10$^{-6}$ or more so as to monitor the single crystal being pulled up in the opaque container by X-ray fluoroscopy. When the X-ray mass absorption coefficient is larger than 5 cm$^2$/g, it is difficult to see the shape of the single crystal by X-ray fluoroscopy. When the X-ray transmittance is less than 10$^{-6}$, contrast of the fluoroscopic image is deteriorated and sufficient detection sensitivity of the X-ray detector is not achieved.

X-ray fluoroscopy is carried out by radiating near the crucible by means of an X-ray generator and detecting X-ray transmitted through the apparatus by an X-ray detector.

The present invention will be hereinafter explained in detail by following Examples.

EXAMPLES

An undoped semi-insulating single crystal of GaAs was pulled up by means of the apparatus of FIG. 2 according to the CZ method.

The apparatus had an outer chamber having an outer diameter of 280 mm made of stainless steel (SUS 304) having a thickness of 4 mm, and the container 1 made of BN-coated graphite having an outer diameter of 150 mm and a wall thickness of 6 mm in the outer chamber. As the liquid sealing material 8, molten B$_2$O$_3$ was used. The crucible 3 was made of PBN and the means for heating the crucible was a carbon heater having a thickness of 8 mm. To the crucible, GaAs having a stoichiometric composition was charged and heated at 1,238° C.

In the reservoir 9 positioned in the container 1, about 50 g of As was charged and heated at about 617° C. to keep the vapor pressure of As in the container at about 1 atm. during pulling up the single crystal.

Figure 3:
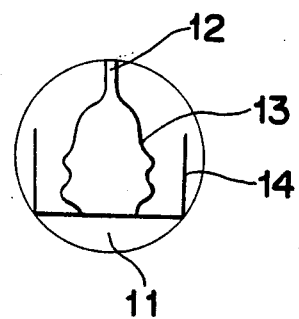
FIG. 3 is a monitoring picture obtained during pulling up the single crystal.

The single crystal in the apparatus was monitored by a fluoroscopic apparatus (Voltage of X-ray tube 105 kV, 2 mA) through a monitoring image as shown in FIG. 3, in which numerals 11, 12, 13 and 14 indicate the molten raw material, the seed crystal, the single crystal and the crucible wall made of PBN, respectively. The total X-ray transmittance of the apparatus is 1.2×10$^{-6}$.

The shaft 4 was pulled up at a pulling rate of 6 mm/min. with a rotation rate of 2 rpm. to obtain 1.1 kg of the single crystal of about 2" in diameter and 90 mm in length.

The thus produced single crystal was analyzed by SIMS (Secondary Ion Mass Spectroscopy) to find that the number of each the impurities (eg. Si, C, O, Al, Mg, Ca, Cr, Fe, etc.) was less than 1×10$^{15}$ cm$^{-3}$, and had good semiinsulating property having specific resistivity of about 10$^8$ ohm.cm.

Measurement of an etch pit density (hereinafter referred to as "EPD") of the single crystal with molten KOH revealed that it had an average EPD of about 3,000 to 6,000 cm$^{-2}$ from the front part to the back part of the single crystal.

Hall mobility of the single crystal was as high as 4,500 cm$^2$/V.sec.

For comparison, a single crystal of GaAs produced by the conventional method was conductive one containing about 6×10$^{16}$ cm$^{-3}$ of Si and having specific resistivity of about 10$^2$ ohm.cm.

What is claimed is:

1. An apparatus for producing a single crystal according to the CZ method, which comprises
    a closed container consisting of upper and lower halves and having a shaft for pulling up the single crystal, in which a single crystal growing portion is provided and a vaporous atmosphere of a volatile element of the crystal is contained, at least that part of said container which contacts said vapor of the elements being made of a material containing an element of the same group of the periodic table as that of component elements of the single crystal, a gap between said shaft and the container and an opening between said upper and lower halves of the container being sealed with B$_2$O$_3$ melt,
    at least one reservoir positioned in the container for supplying vapor of a volatile component element of the single crystal, and
    a heating means provided around the container; wherein a hot zone of the apparatus including the container is made of a material which has an X-ray mass absorption coefficient not larger than 5 cm$^2$/g, and said material of the hot zone has such thickness that X-ray transmittance through the whole hot zone is 10$^{-6}$ or more so as to monitor the single crystal being pulled up by X-ray fluoroscopy.

2. An apparatus according to claim 1, wherein a part of the container is made of a material selected from the group consisting of boron nitride, pyrolytic boron nitride, aluminum nitride, graphite and quartz coated with a material selected from the group consisting of boron nitride, pyrolytic boron nitride and aluminum nitride.

3. An apparatus according to claim 1, which is used for producing a single crystal of GaAs.

4. An apparatus according to claim 1 wherein the inner portion of said container which contacts said vapor is made of a material containing an element of the same group of the periodic table as that of the component elements of the single crystal.

* * * * *